(12) United States Patent
Han

(10) Patent No.: US 10,303,228 B2
(45) Date of Patent: May 28, 2019

(54) MULTI-DIRECTIONAL COOLING STRUCTURE FOR INTERFACE CARD

(71) Applicant: EVGA CORPORATION, New Taipei (TW)

(72) Inventor: Tai-Sheng Han, New Taipei (TW)

(73) Assignee: EVGA CORPORATION, New Taipei (TW)

( * ) Notice: Subject to any disclaimer, the term of this patent is extended or adjusted under 35 U.S.C. 154(b) by 0 days.

(21) Appl. No.: 15/604,676

(22) Filed: May 25, 2017

(65) Prior Publication Data

US 2018/0307280 A1    Oct. 25, 2018

(30) Foreign Application Priority Data

Apr. 21, 2017 (TW) .............................. 106205630 U

(51) Int. Cl.
*G06F 1/20* (2006.01)
*H05K 7/20* (2006.01)

(52) U.S. Cl.
CPC ........... *G06F 1/20* (2013.01); *H05K 7/20509* (2013.01)

(58) Field of Classification Search
CPC ... H01L 23/427; H01L 23/467; H01L 23/473; H01L 2224/48091; G06F 1/20; G06F 1/203; G06F 2200/201; G06F 1/1656; G06F 1/206; G06F 1/1637; G06F 1/183; G06F 1/184; H05K 7/20336; H05K 7/20809; H05K 7/20772; H05K 7/2079; H05K 7/20836; H05K 1/0203; H05K 7/20781; H05K 7/20727; H05K 7/20327; H05K 7/2039; H05K 2201/064; F28D 15/0266; F28D 15/0275; F28D 15/02; F28D 15/0233; F28D 15/00; F28F 3/12; F28F 3/02; F28F 9/26

See application file for complete search history.

(56) References Cited

U.S. PATENT DOCUMENTS

| 6,351,382 | B1 * | 2/2002 | Nakanishi | ................. G06F 1/20 165/80.3 |
| 6,388,882 | B1 * | 5/2002 | Hoover | ............... F28D 15/0266 165/104.33 |
| 6,994,151 | B2 * | 2/2006 | Zhou | ..................... H01L 23/427 165/104.21 |
| 7,304,846 | B2 * | 12/2007 | Wang | ................. H05K 7/20445 165/104.21 |

(Continued)

*Primary Examiner* — Adam B Dravininkas
(74) *Attorney, Agent, or Firm* — Leong C. Lei

(57) ABSTRACT

A multi-directional cooling structure for an interface card includes: a first cooling plate, configured on the interface card; a second cooling plate, configured at one side of the first cooling plate; at least one heat conduction element, configured on the first cooling plate and second cooling plate, and including a first heat conduction portion positioned on the first cooling plate and a second heat conduction portion in connection with the first heat conduction portion and positioned on the second cooling plate; and at least one cooling fin set, configured on one side of the heat conduction element away from the first and second cooling plates, and in direct contact with the heat conduction element. Therefore, the heat can be conducted not only to one side through the heat conduction element but to the cooling fin sets above, advantageously achieving multi-directional heat dissipation.

5 Claims, 6 Drawing Sheets

(56) References Cited

U.S. PATENT DOCUMENTS

| | | | | |
|---|---|---|---|---|
| 7,310,226 | B2* | 12/2007 | Chen | H01L 23/4093 |
| | | | | 165/121 |
| 7,529,090 | B2* | 5/2009 | Peng | G06F 1/20 |
| | | | | 165/104.33 |
| 7,852,630 | B2* | 12/2010 | Cheng | F25B 21/00 |
| | | | | 165/104.33 |
| 7,907,407 | B2* | 3/2011 | Ho | G06F 1/203 |
| | | | | 165/104.33 |
| 10,091,911 | B2* | 10/2018 | Kelty | H05K 7/20672 |
| 2003/0111213 | A1* | 6/2003 | Chang | F28D 15/02 |
| | | | | 165/104.33 |
| 2003/0189815 | A1* | 10/2003 | Lee | H01L 23/427 |
| | | | | 361/719 |
| 2004/0095721 | A1* | 5/2004 | Ellsworth, Jr. | H01L 23/467 |
| | | | | 361/694 |
| 2005/0068728 | A1* | 3/2005 | Chu | G06F 1/20 |
| | | | | 361/690 |
| 2005/0207115 | A1* | 9/2005 | Barsun | G06F 1/20 |
| | | | | 361/690 |
| 2008/0158820 | A1* | 7/2008 | Peng | H01L 23/427 |
| | | | | 361/703 |
| 2008/0225486 | A1* | 9/2008 | Cheng | G06F 1/20 |
| | | | | 361/699 |
| 2008/0247136 | A1* | 10/2008 | Peng | G06F 1/20 |
| | | | | 361/697 |
| 2010/0165566 | A1* | 7/2010 | Li | G06F 1/20 |
| | | | | 361/679.47 |
| 2014/0160679 | A1* | 6/2014 | Kelty | H05K 7/20672 |
| | | | | 361/700 |

\* cited by examiner

MULTI-DIRECTIONAL COOLING STRUCTURE FOR INTERFACE CARD

(a) TECHNICAL FIELD OF THE INVENTION

The present invention relates to a cooling structure for an interface card, and more particularly to a multi-directional cooling structure for an interface card, which has a very good cooling effect.

(b) DESCRIPTION OF THE PRIOR ART

Personal computers are developed fast; users not only require computer processing speed, but also pay more attention to the stability of the computer. Because semiconductor integrated circuit technologies are progressed significantly and micrometer, nanometer technologies have breakthrough, the number of semiconductors in one chip is increased from original dozens up to the current tens of millions. Although the technical progress allows personal computers to be much cheaper and the performance of electronic components to be improved significantly, cooling capacity is often unable to go hand in hand with the manufacturing process.

In addition, the enhancement of personal computer processing speed is generally achieved through the combination of different functions of interface cards. Taking graphics cards as an example, manufacturers have launched products with faster processing speed one after another to meet consumers' requirements so that all the working clocks of the chips on the graphics card are up to hundreds of megahertz, and thus, heat comes with the high frequency working speed.

Therefore, if high heat generated in a graphics card cannot be excluded through effective cooling designs, power consumption is increased in a less serious case, and much worse, electronic components might be damaged to shorten processor life such that the efficiency, reliability and stability of processor will be affected seriously.

So, some manufacturers have designed a side opening at one side of the graphics card, allowing the heat generated from the graphics card to be dissipated by the wind flowing in the side opening to achieve the purpose of cooling. But, such kind of cooling technology only has a limited cooling effect, and bad cooling still happens often to lead to some problems such as temperature being too high in the graphics card.

SUMMARY OF THE INVENTION

The main object of the present invention is to provide a multi-directional cooling structure for an interface card, allowing the heat collected by first and second cooling plates to be dissipated quickly through a heat conduction element and cooling fin sets through the particular designs of the heat conduction element and cooling fin sets, advantageously achieving multi-directional heat dissipation.

To achieve the object mentioned above, the present invention proposes a multi-directional cooling structure for an interface card, including: a first cooling plate, configured on the interface card; a second cooling plate, configured at one side of the first cooling plate; at least one heat conduction element, configured on the first cooling plate and second cooling plate, and including a first heat conduction portion positioned on the first cooling plate and a second heat conduction portion in connection with the first heat conduction portion and positioned on the second cooling plate; and at least one cooling fin set, configured on one side of the heat conduction element away from the first and second cooling plates, and in direct contact with the heat conduction element. Whereby, the heat generated from the interface card is collected by the first cooling plate and then transferred to the second heat conduction portion through the first heat conduction portion of the heat conduction element, the second cooling plate sharing responsibility for the absorption of the heat. At the same time, the heat is conducted to the cooling fin sets from the surface of the heat conduction element. It can be known from the above description that the heat can be conducted not only to one side through the heat conduction element but to the cooling fin sets above, advantageously achieving multi-directional heat dissipation.

DETAILED DESCRIPTION OF THE PREFERRED EMBODIMENTS

Figure 1:
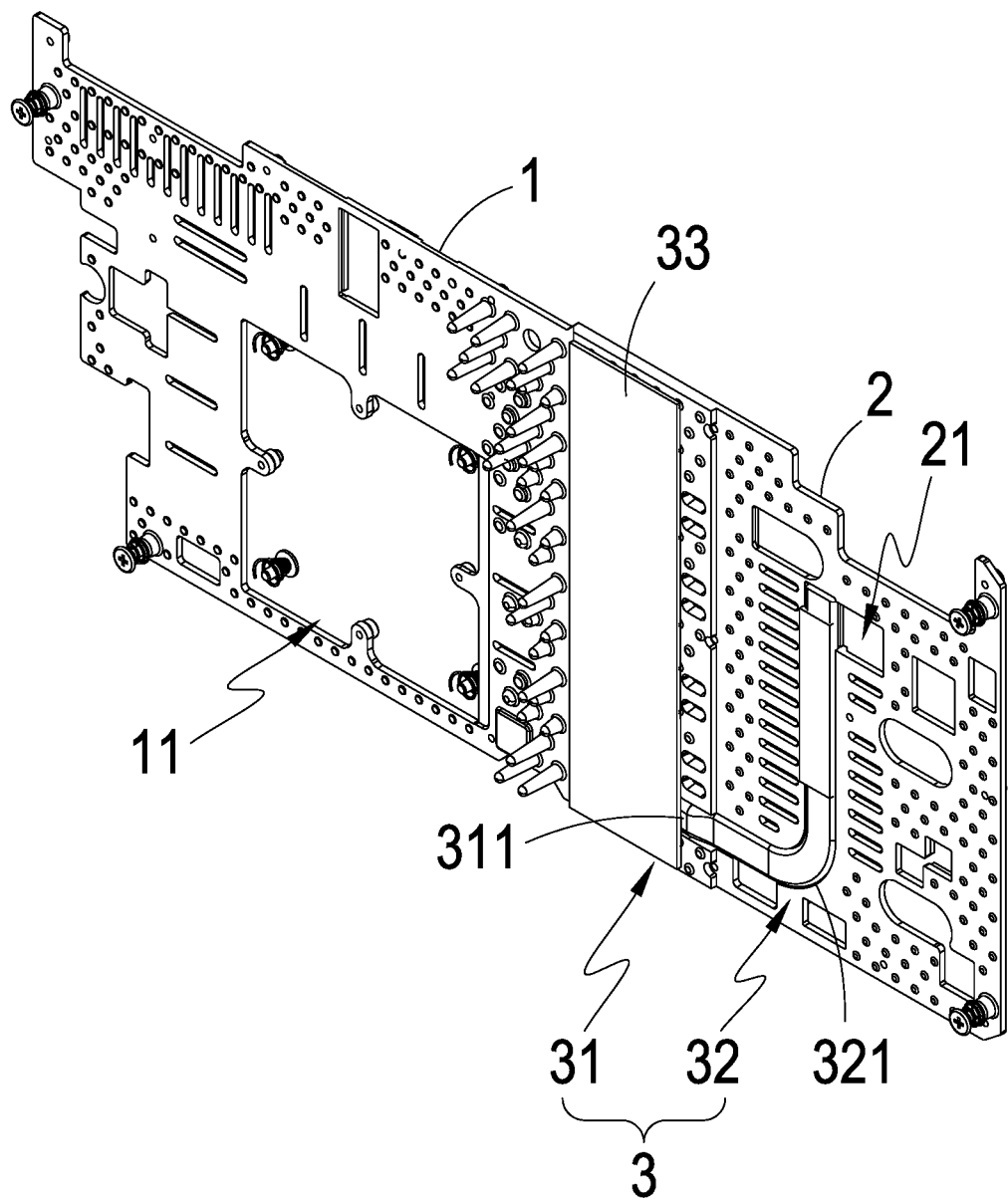
FIGS. 1 and 2 respectively are a perspective view of first and second cooling plates of the present invention.
Figure 2:
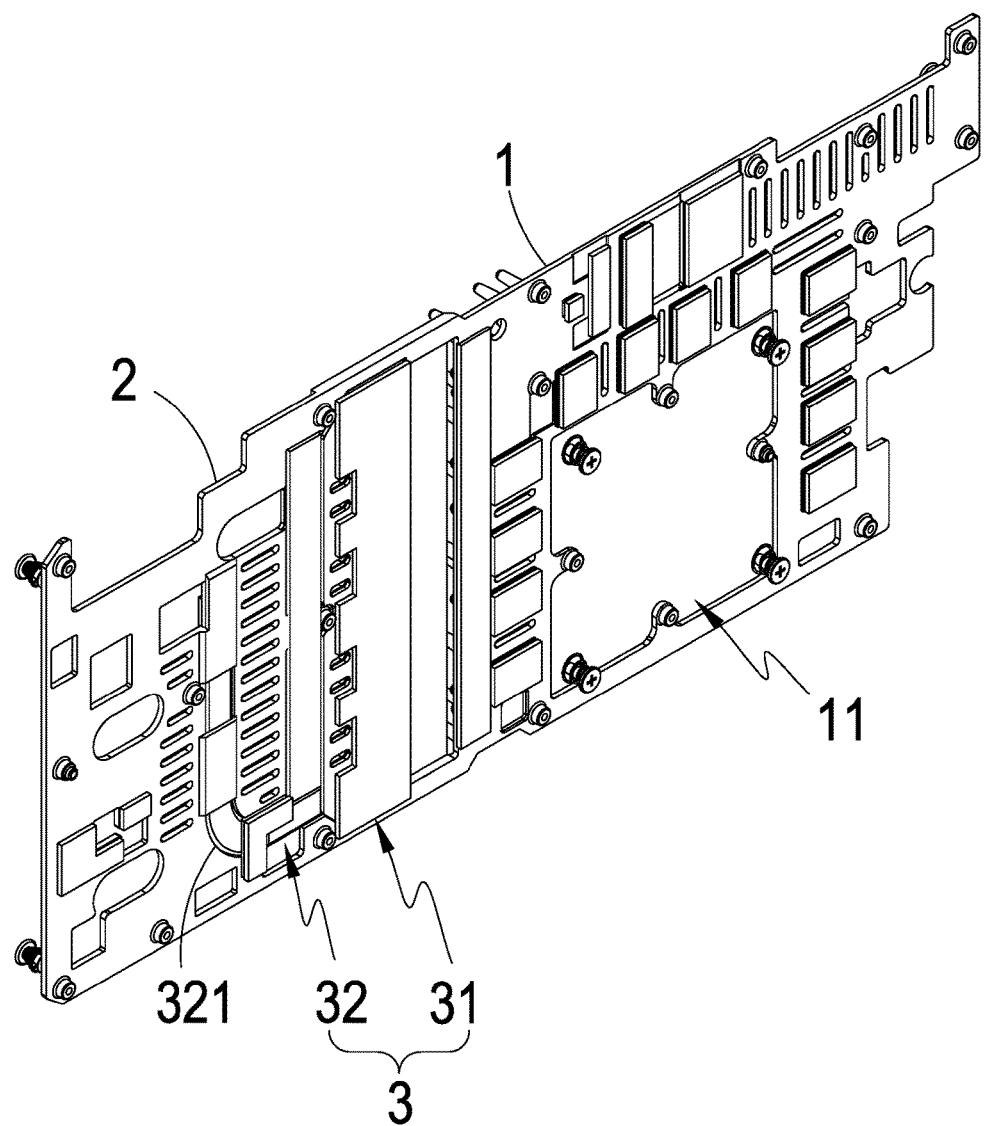
Figure 3:
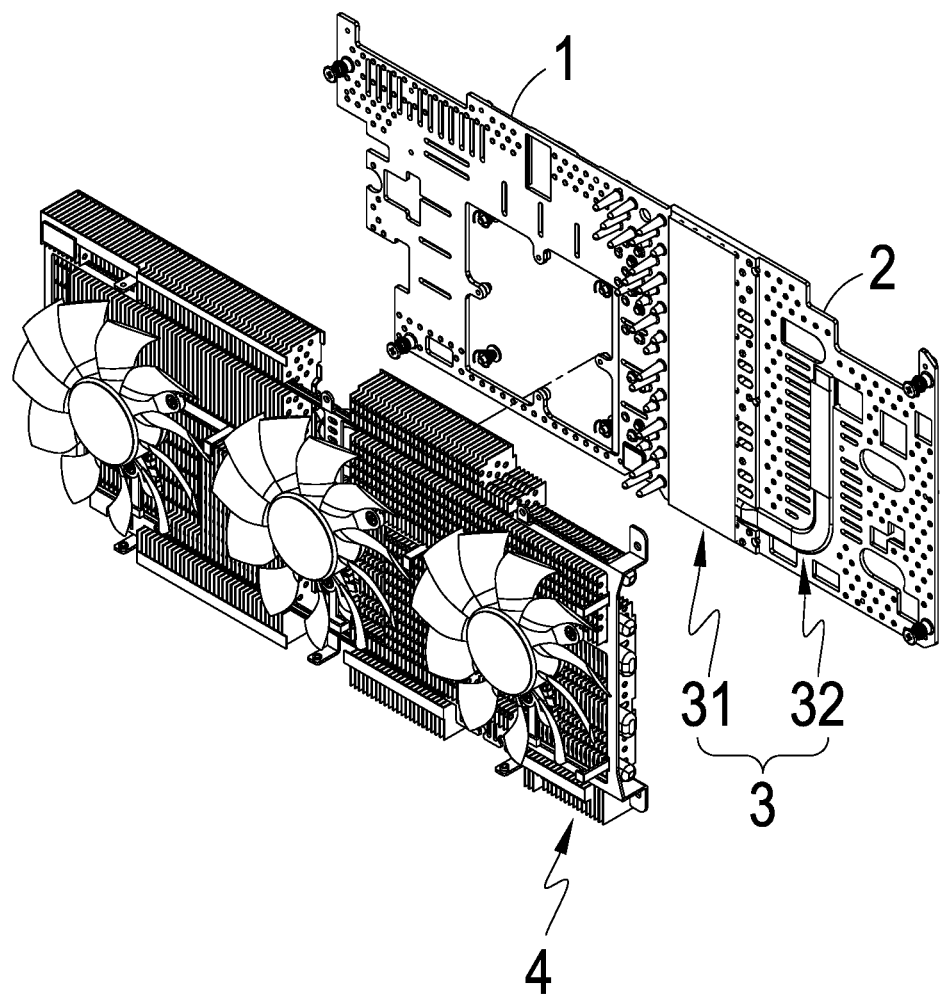
FIG. 3 is an exploded view of a preferred embodiment of the present invention.
Figure 4:
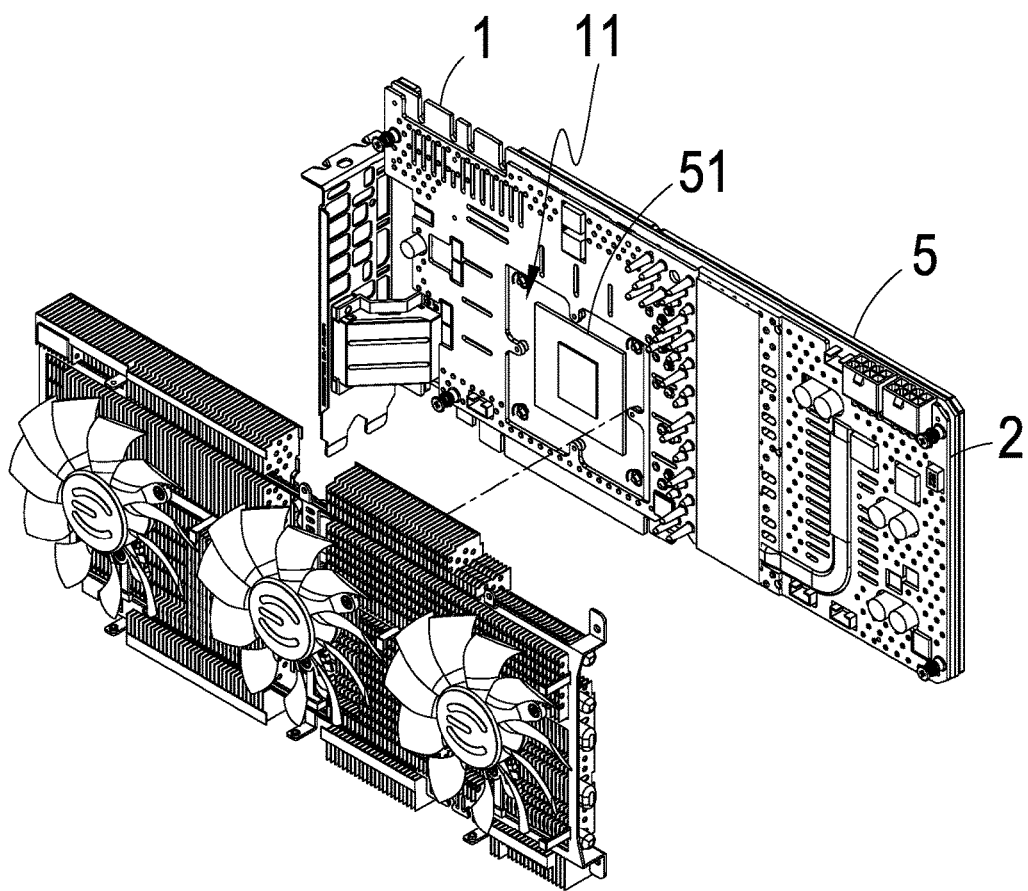
FIG. 4 is an exploded view of the embodiment of the present invention in combination with an interface card.
Figure 5:
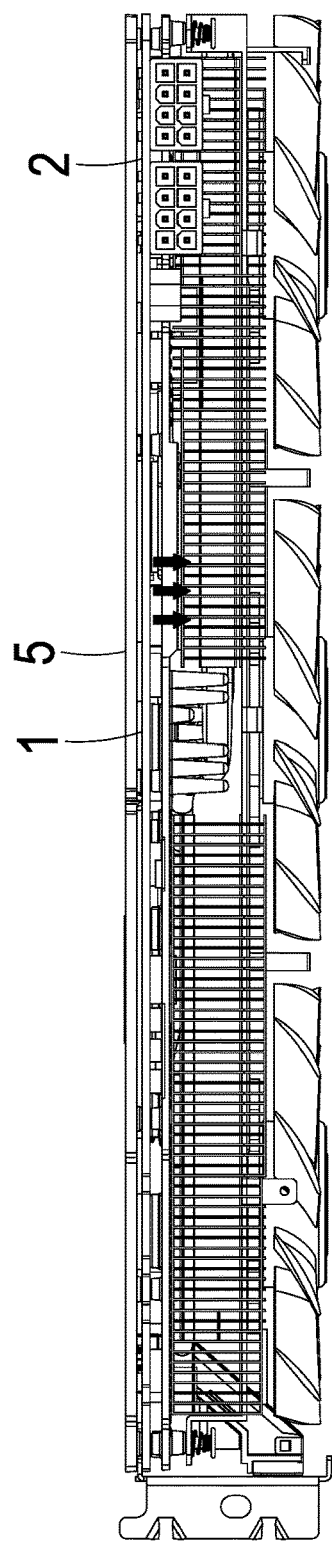
FIG. 5 is a side view of the embodiment of the present invention in combination with the interface card, showing a heat dissipation route.
Figure 6:
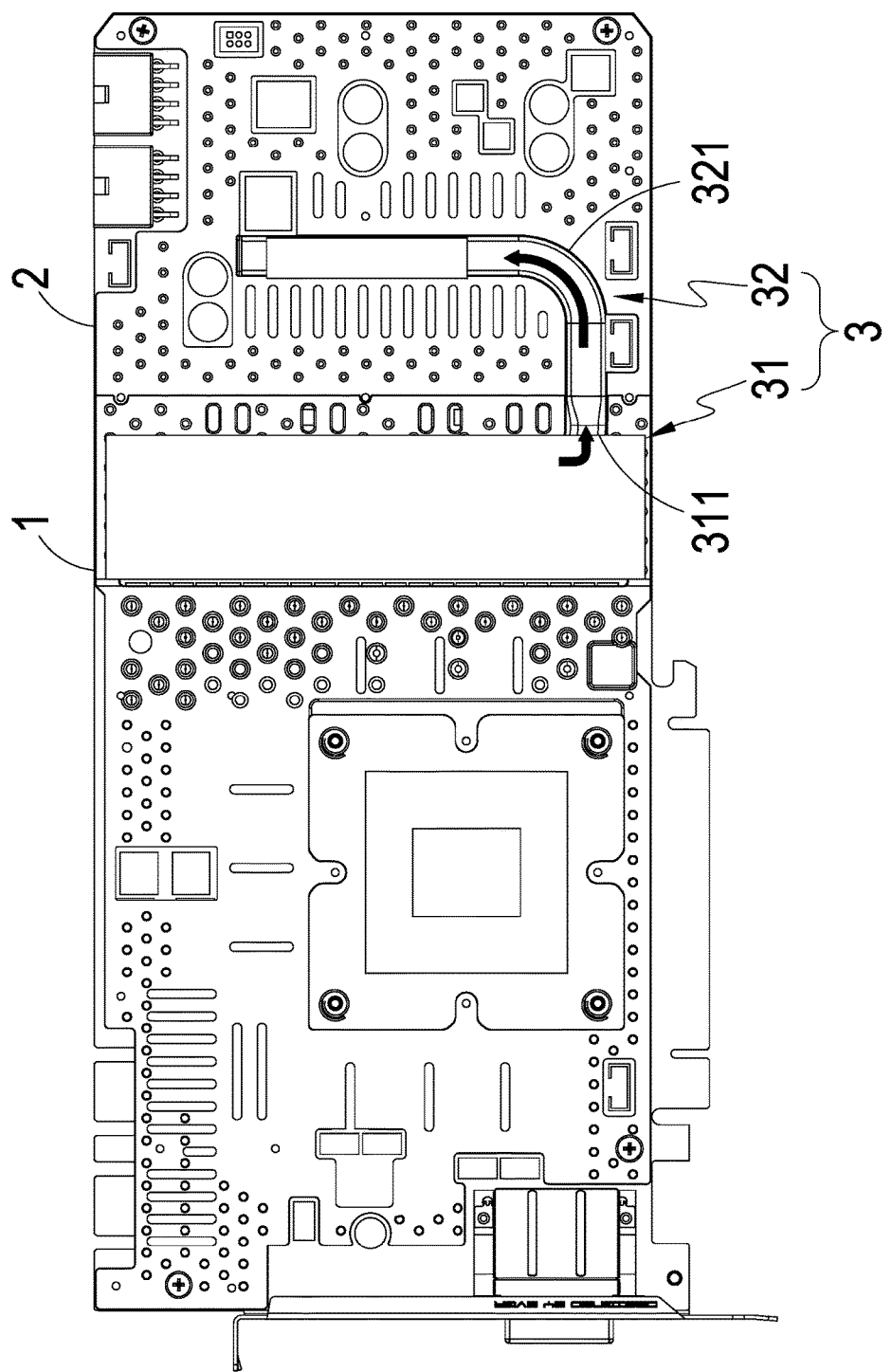
FIG. 6 shows the heat dissipation route of the embodiment of the present invention in combination with the interface card.

Referring to FIGS. 1 to 3, a multi-directional cooling structure for an interface card of the present invention includes: a first cooling plate 1, configured on an interface card, a plurality of hollow portions 11 allowing electric components configure on the interface card to be passed through being configured on the first cooling plate 1; a second cooling plate 2, configure at one side of the first cooling plate 1, a plurality of hollow portions 11 allowing other electric components configure on the interface card to be passed through being configured on the second cooling plate 2; at least one heat conduction element 3, configured on the first cooling plate 1 and second cooling plate 2 and having at least one thermally conductive patch 33, and including a first heat conduction portion 31 positioned on the first cooling plate 1 and having at least one bending portion 311 and a second heat conduction portion 32 in connection with the first heat conduction portion 31, positioned on the second cooling plate 2 and having at least one second bending portion 321; and at least one cooling fin set 4, configured on one side of the heat conduction element 3 away from the first cooling plate 1 and second cooling plate 2, and directly in contact with the heat conduction element 3.

Referring to FIGS. 1 to 5, the interface card 5 may be a display card, motherboard, network card, or sound card. In a preferred embodiment, the display card is taken as an example for explanation, but the present invention is not so limited. When the interface card 5 is in combination with the first and second cooling plates 1, 2, a part of electronic components on the interface card 5 will be passed through the respective hollow portions 11 and exposed out thereof, and an electronic components 51 not corresponding to any hollow portion 11 will then be directly in contact with the first and second cooling plates 1, 2 for heat conduction through the surfaces thereof. When the first and second cooling plates 1, 2 receive the heat from the interface card 4, the heat can be conducted to the second bending portion 321 and second heat conduction portion 32 through the first heat conduction portion 31 and first bending portion 311 through the heat conduction element 3, advantageously forming horizontal heat conduction to the colder zone of second heat conduction plate 2. More importantly, the first and second heat conduction portions 31, 32 are respectively in direct contact with the cooling fin set 4 through the thermally conductive patches 33 so as to facilitate the heat conduction; it is namely that the heat can be dissipated simultaneously through the thermally conductive patches 33 and cooling fin set 4 when it is conducted from the first heat conduction portion 31 to second heat conduction portion 32, advantageously achieving horizontal and vertical heat dissipation. Furthermore, the above heat conduction element 3 is made of copper or other highly heat-conductive material.

From the description mentioned above, the present invention has the following advantages over the prior arts: the particularly designs of the heat conduction elements 3 and cooling fin sets 4 allows the heat collected by the first and second cooling plates 1, 2 to be dissipated quickly through the heat conduction elements 3 and cooling fin sets 4, advantageously achieving multi-directional heat dissipation.

I claim:

1. A multi-directional cooling structure for an interface card, comprising:
    a first cooling plate, configured on said interface card to receive a first part of heat emerging from said interface card so as to serve as a first zone exhibiting a first temperature;
    a second cooling plate, configured at one side of said first cooling plate to receive a second part of heat emerging from said interface card so as to serve as a second zone exhibiting a second temperature that is lower than the first temperature;
    at least one heat conduction element, attached to a combination of said first cooling plate and said second cooling plate, and comprising a first heat conduction portion in connection with said first cooling plate and a second heat conduction portion in connection with said first heat conduction portion and positioned on said second cooling plate such that a fraction of the first part of heat received in said first cooling plate is transmitted through the first heat conduction portion and the second heat conduction portion of said at least one conduction element to the second cooling plate to thereby homogenize temperature distribution of said interface card between the first and second zones; and
    at least one cooling fin set, configured on one side of said heat conduction element away from said first and second cooling plates, and in direct contact with at least one thermally conductive patch that is configured on said heat conduction element to conduct heat away from said heat conduction element in a direction away from said interface card.

2. The structure according to claim 1, wherein said first heat conduction portion has at least one first bending portion.

3. The structure according to claim 2, wherein said second heat conduction portion has at least one second bending portion.

4. The structure according to claim 3, wherein said first and second cooling plates respectively have a plurality of hollow portions allowing electronic components configured on said interface card to be passed through.

5. The structure according to claim 1, wherein said interface card is a display card, motherboard, network card or sound card.

* * * * *